(12) United States Patent
Bains et al.

(10) Patent No.: US 7,957,216 B2
(45) Date of Patent: Jun. 7, 2011

(54) COMMON MEMORY DEVICE FOR VARIABLE DEVICE WIDTH AND SCALABLE PRE-FETCH AND PAGE SIZE

(75) Inventors: Kuljit S. Bains, Olympia, WA (US); John Halbert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 119 days.

(21) Appl. No.: 12/241,192

(22) Filed: Sep. 30, 2008

(65) Prior Publication Data

US 2010/0080076 A1 Apr. 1, 2010

(51) Int. Cl.
*G11C 8/00* (2006.01)
(52) U.S. Cl. ............... 365/230.03; 365/193; 365/230.01
(58) Field of Classification Search ............ 365/230.01, 365/230.03, 191, 193
See application file for complete search history.

(56) References Cited

U.S. PATENT DOCUMENTS

| | | | | |
|---|---|---|---|---|
| 5,754,436 | A * | 5/1998 | Walsh et al. ................. | 713/300 |
| 5,893,927 | A * | 4/1999 | Hovis ........................... | 711/171 |
| 6,643,758 | B2 * | 11/2003 | Furuyama et al. ............ | 711/203 |
| 6,751,159 | B2 * | 6/2004 | Farrell et al. ................ | 365/238.5 |
| 6,889,304 | B2 * | 5/2005 | Perego et al. ................ | 711/170 |
| 2002/0031035 | A1 | 3/2002 | Tsuji et al. | |
| 2003/0081492 | A1 | 5/2003 | Farrell et al. | |
| 2005/0157579 | A1 | 7/2005 | Perego et al. | |
| 2006/0067146 | A1 | 3/2006 | Woo et al. | |
| 2007/0271441 | A1 * | 11/2007 | Shaw et al. .................. | 712/41 |
| 2008/0091920 | A1 * | 4/2008 | Shaw et al. .................. | 712/202 |

FOREIGN PATENT DOCUMENTS

| | | |
|---|---|---|
| WO | 2010/039625 A2 | 4/2010 |
| WO | 2010/039625 A3 | 7/2010 |

OTHER PUBLICATIONS

C Ma et al., "A DRAM Precharge Policy Based on Address Analysis", IEEE Computer Society, 10th Euromicro Conference on Digital System Design Architecture, Methods and Tools, 2007.
B. Jacob, "A Case for Studying DRAM Issues at the System Level", IEEE Computer Society, 2003.
International Search Report and Written opinion received for PCT Patent Application No. PCT/US2009/058531, mailed on Apr. 30, 2010, 11 pages.

* cited by examiner

*Primary Examiner* — Gene N Auduong
(74) *Attorney, Agent, or Firm* — Philip A. Pedigo

(57) ABSTRACT

Embodiments of the invention are generally directed to systems, methods, and apparatuses for a common memory device for variable device width and scalable pre-fetch and page size. In some embodiments, a common memory device (such as a DRAM) can operate in any of a number of modes including, for example, a x4 mode, a x8 mode, and a x16 mode. The page size provided by the DRAM may vary depending on the mode of the DRAM. In some embodiments, the amount of data pre-fetched by the DRAM also varies depending on the mode of the DRAM.

30 Claims, 5 Drawing Sheets

COMMON MEMORY DEVICE FOR VARIABLE DEVICE WIDTH AND SCALABLE PRE-FETCH AND PAGE SIZE

TECHNICAL FIELD

Embodiments of the invention generally relate to the field of integrated circuits and, more particularly, to systems, methods and apparatuses for a common memory device for variable device width and scalable pre-fetch and page size.

BACKGROUND

Each generation of dynamic random access memory (DRAM) typically doubles the amount of data that is pre-fetched during a memory access. For example, double data rate (DDR) 2 pre-fetches twice as much data as DDR1. Similarly, DDR3 pre-fetches twice as much data as DDR2. The width of the internal DRAM bus increases with the amount of data that is pre-fetched. As the width of the internal DRAM bus increases, the die size of the DRAM also increases.

DRAM is available in different device widths such as x4, x8, x16, and the like. The term "device width" refers to the width of the external DRAM bus with which a DRAM is designed to interoperate. Currently x4 and x8 wide DRAM devices have a page size of 1K Bytes and x16 wide DRAM devices have a page size of 2K Bytes. A "page" refers to the number of bits that are activated by a row address strobe (RAS) command.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments of the invention are generally directed to systems, methods, and apparatuses for a common memory device for variable device width and scalable pre-fetch and page size. In some embodiments, a common memory device (such as a DRAM) can operate in any of a number of modes including, for example, a x4 mode, a x8 mode, and a x16 mode. The page size provided by the DRAM may vary depending on the mode of the DRAM. In some embodiments, the amount of data pre-fetched by the DRAM also varies depending on the mode of the DRAM. As is further discussed below, the use of variable page sizes and pre-fetch amounts may help to reduce the die size of the DRAM and the amount of power used by the device.

Figure 1:
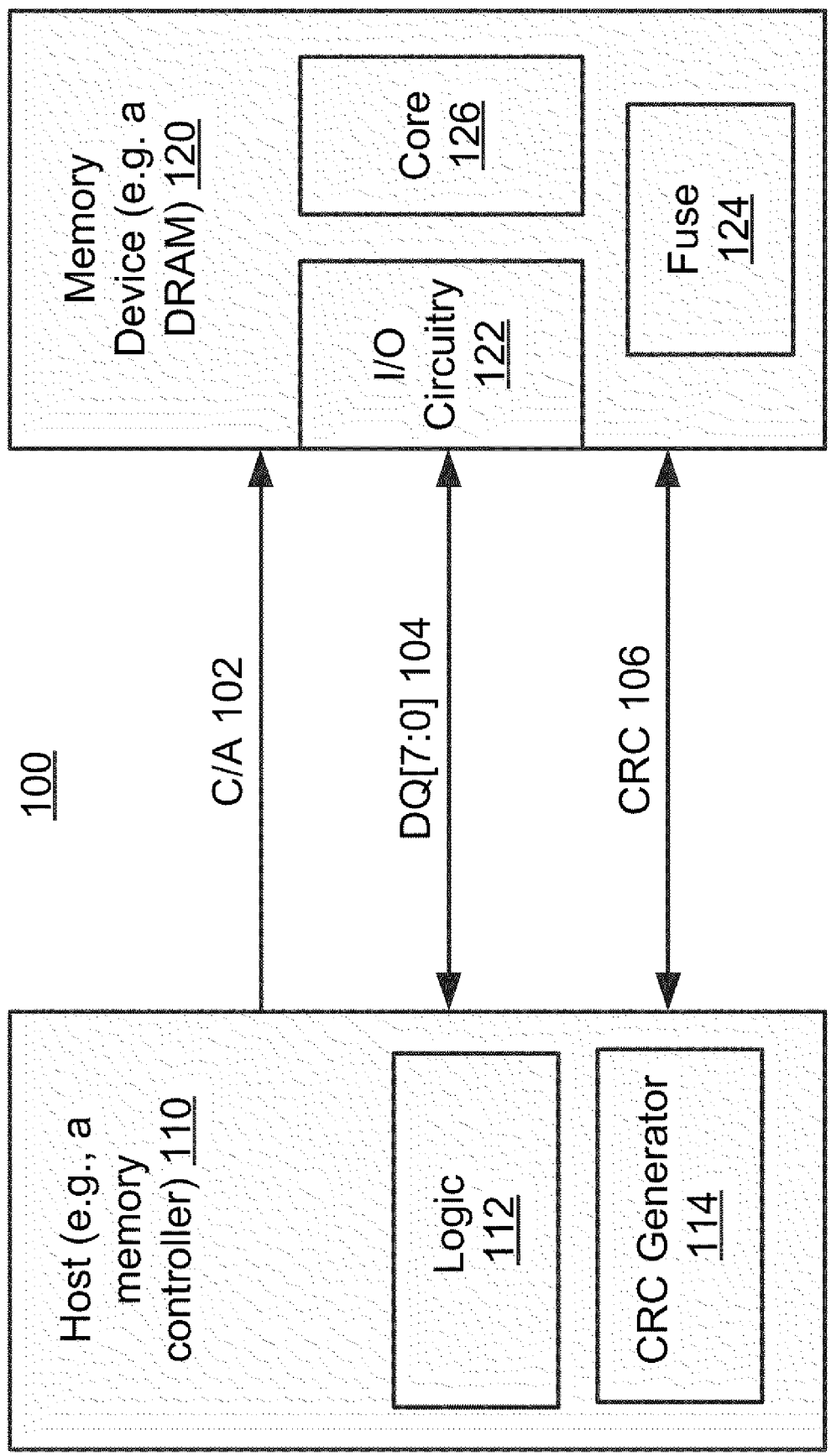
FIG. 1 is a high-level block diagram illustrating selected aspects of a computing system implemented according to an embodiment of the invention.

FIG. 1 is a high-level block diagram illustrating selected aspects of a computing system implemented according to an embodiment of the invention. In the illustrated embodiment, system 100 includes host 110 (e.g., a memory controller) and memory device 120 (e.g., a dynamic random access memory device or DRAM). In alternative embodiments, system 100 may include more elements, fewer elements, and/or different elements.

Command/Address (C/A) lanes 102 provide a plurality of lanes for sending commands and addresses to memory device 120. DQ lanes 104 provide a bi-directional read/write data bus. CRC lanes 106 provide a bi-directional bus to transfer CRC checksum bits. In alternative embodiments, DQ lanes 104 and/or CRC lanes 106 may be unidirectional. For ease of description, embodiments of the invention are described with reference to a x8 memory device. It is to be appreciated, however, that embodiments of the invention may include other device data widths such as x4, x16, x32, etc.

Host 110 controls the transfer of data to and from memory device 120. Host 110 includes logic 1 12. As is further described below, memory device 120 supports variable page size and has variable bank resources available depending on its mode. Logic 112 enables host 110 to interact with a memory device having these features. That is, logic 112 enables host 110 to interact with a memory device having variable page sizes. Logic 112 also enables host 110 to interact with a memory device having variable bank resources (e.g., x number of banks in x4 mode and y number of banks in x8 mode). This approach is further described below with reference to FIGS. 2-5. For ease of illustration, logic 112 is illustrated as a single block of logic. It is to be appreciated, however, that the functions provided by logic 112 may be performed by logic that is not necessarily collocated on host 110.

Host 110 may also include CRC generator 114. In systems that support the use of CRC, CRC generator 114 generates a local CRC that can be compared with a CRC checksum from memory device 120 to determine whether transmitted data has been corrupted. In addition, a CRC is generated for write transactions and sent to the memory device in the write frame (in systems that support the use of CRC).

Memory device 120 provides (at least a portion of) main system memory for system 100. In some embodiments, memory device 120 is a dynamic random access memory device (DRAM). Memory device 120 includes, inter alia, input/output (I/O) circuitry 122, fuse (or other suitable logic) 124, and core 126 (e.g., a memory array). I/O circuitry 122 includes circuitry suitable for receiving and/or transmitting signals over one or more interconnects (such as C/A 102, DQ 104, and/or CRC 106). For ease of illustration, I/O circuitry 122 is illustrated as a single block of logic. It is to be appreciated, however, that the functions provided by I/O circuitry 122 may be performed by logic that is not necessarily collocated on memory device 120.

In some embodiments, memory device (or, for ease of reference, DRAM) 120 provides a common die solution for a number of different device widths. That is, a common die that supports multiple device widths (e.g., x4, x8, x16, etc.) can be hardcoded (or otherwise configured) to operate at a particular device width. In the illustrated embodiment, for example, DRAM 120 is formed on a die that can (or could) be configured to operate as a x4, x8, or x16 device. Fuse 124 is set to configure DRAM 120 as (for example) a x8 device.

DRAM 120 may be packaged differently, depending on the device width that it is configured to support. For example, if DRAM 120 is fused for a x8 mode, then its package may have 8 DQ connectors. If DRAM 120 is fused for a x4 mode, then its package may have at least 4 connectors. Similarly, if DRAM 120 is fused for a x16, then its package may have 16 connectors.

In alternative embodiments, the mode may be dynamically configured during (for example) initialization. For example, a register bit (not shown) may be set during initialization to specify the mode for DRAM 120. Once the register bit is set, DRAM 120 may provide a page size and/or a pre-fetch amount based on the selected mode.

In some embodiments, the page size provided by DRAM 120 is scaled based on the device width of DRAM 120. The term "page" refers to the number of bits activated in a row (and moved into the sense amps) of (for example) core 126. In some embodiments, each bank of core 126 provides a page size of N. The number of physical banks of core 126 opened in response to a RAS increases with the device width selected for DRAM 120. For example, one physical bank (having a page size of N) is activated in response to a RAS if DRAM 120 is in x4 mode. Two physical banks (having an effective page size of 2N) are activated in response to a RAS if DRAM 120 is in x8 mode. Similarly, four physical banks (having an effective page size of 4N) may be activated if DRAM 120 is in x16 mode. In some embodiments N is equal to ½K bits. In alternative embodiments, N may have a different value.

The number of bits activated in a row directly corresponds to the amount of power consumed in an operation. That is, the more bits that are activated (and the wider the page size), the more power an operation uses. In conventional systems, x4 and x8 devices use the same page size (e.g., 1K). Thus, in conventional systems, the x4 devices present the worst case for power consumption because 18 devices are activated in parallel (16 devices for the data path and 2 devices for error correction). Embodiments of the invention may reduce the power consumed in systems using x4 devices because each device has a smaller page size (in x4 mode) and, thus, consumes less power than a conventional device. Variable page sizes are further discussed below with reference to FIGS. 2-5.

In some embodiments, the amount of data pre-fetched by DRAM 120 is scaled based on the device width of DRAM 120. In operation, a RAS command may activate a row of data and a CAS command may extract a desired amount of data from the sense amps. As mentioned above, the number of physical banks that are activated is scaled to the device width of DRAM 120. In some embodiments, bits may be pre-fetched from more than one physical bank based on the device width. For example, M bits may be pre-fetched from a single physical bank if DRAM 120 is in a x4 mode. If DRAM 120 is in a x8 mode, then 2M bits (1M bits each from two physical banks) of data may be pre-fetched. Similarly, 4M bits may be pre-fetched if DRAM 120 is in a x8 mode. In some embodiments M is equal to 32 bits. In alternative embodiments, M may have a different value.

The number of bits that are pre-fetched corresponds to the die size of DRAM 120. This is because many memory devices are designed to have internal buses that are suitable for the "worst" case. For example, conventional x16 devices have a 128 bit wide internal bus which is routed throughout the device. As device widths increase, the size of the internal bus increasingly becomes an important driver in the die size of the memory device. In some embodiments, the die size issue is solved by pre-fetching bits from more than one physical bank at the same time. Each bank is coupled to the internal bus so accessing them in parallel provides more bits on the same internal bus. Scalable pre-fetching is further discussed below with reference to FIGS. 2-5.

Figure 2:
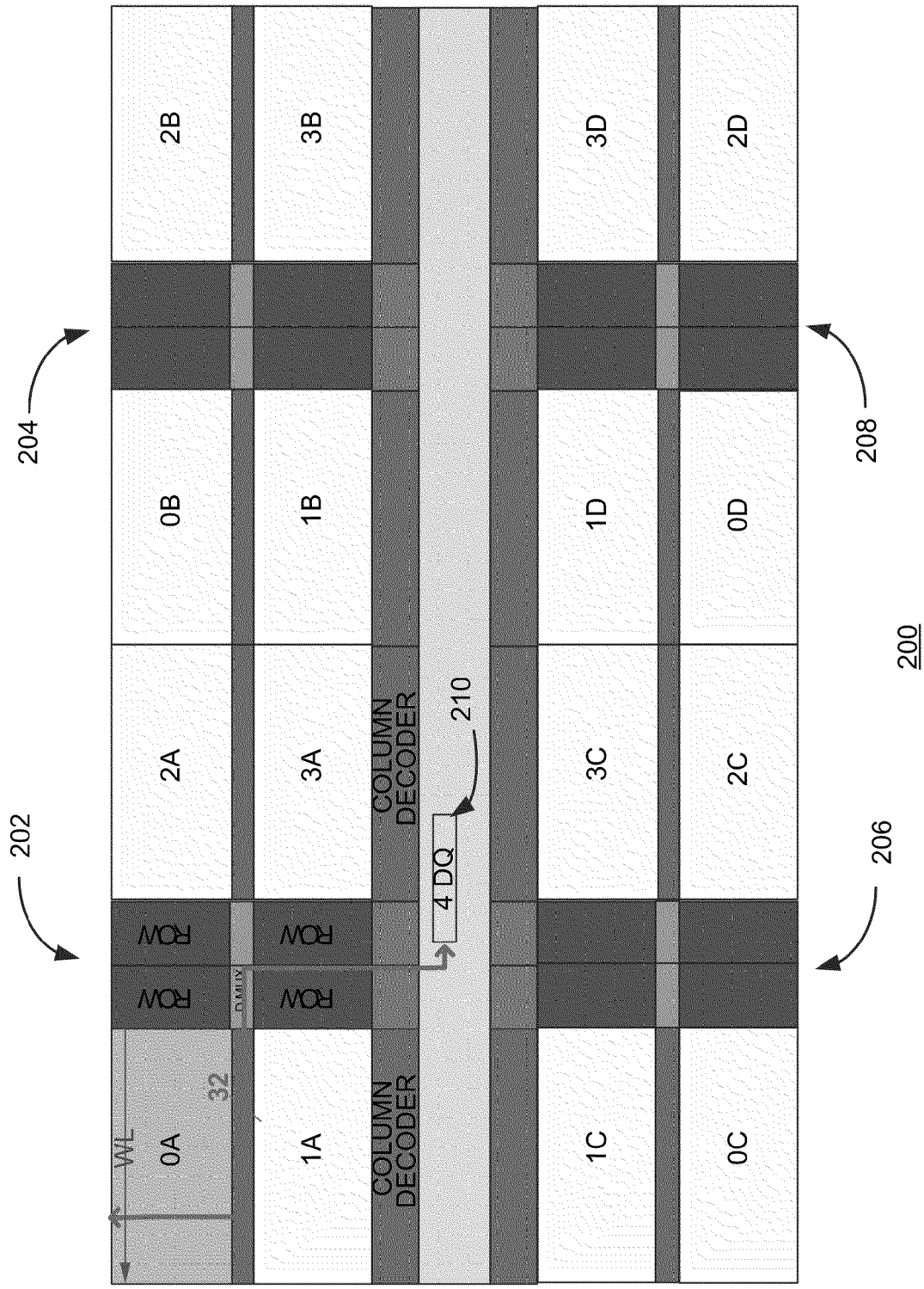
FIG. 2 is a block diagram illustrating selected aspects of a x4 DRAM device implemented according to an embodiment of the invention.

FIG. 2 is a block diagram of a DRAM (e.g., DRAM 120, shown in FIG. 1) in x4 mode, according to an embodiment of the invention. DRAM 200 has 16 physical banks (e.g., 0A, 0B, 1A, etc.) organized as four bank groups (202-208). Each bank group includes four banks. For example, bank group 202 includes banks 0A, 2A, 1A, and 3A. Each bank has a page size of N. In some embodiments, N is ½K. In alternative embodiments, N may have a different value.

M bits are pre-fetched internally (e.g., from each accessed physical bank) to satisfy the external requirements which, in some embodiments, may range from 1.6 to 3.2 GT/s. In the illustrated embodiment, for example, 32 bits are pre-fetched from bank 0A and provided to DQ pads 210. It is to be appreciated that, in alternative embodiments, M may have a different value. In some embodiments, the internal core frequency ranges from 200 to 400 MHZ. That is, the internal frequency may be $\frac{1}{8}^{th}$ of the external frequency as the internal bus may be 8 times as wide for a x4 device. In alternative embodiments, the range of the internal frequency, the range of the external frequency, and/or the ratio between the internal and external frequencies may be different.

Figure 3:
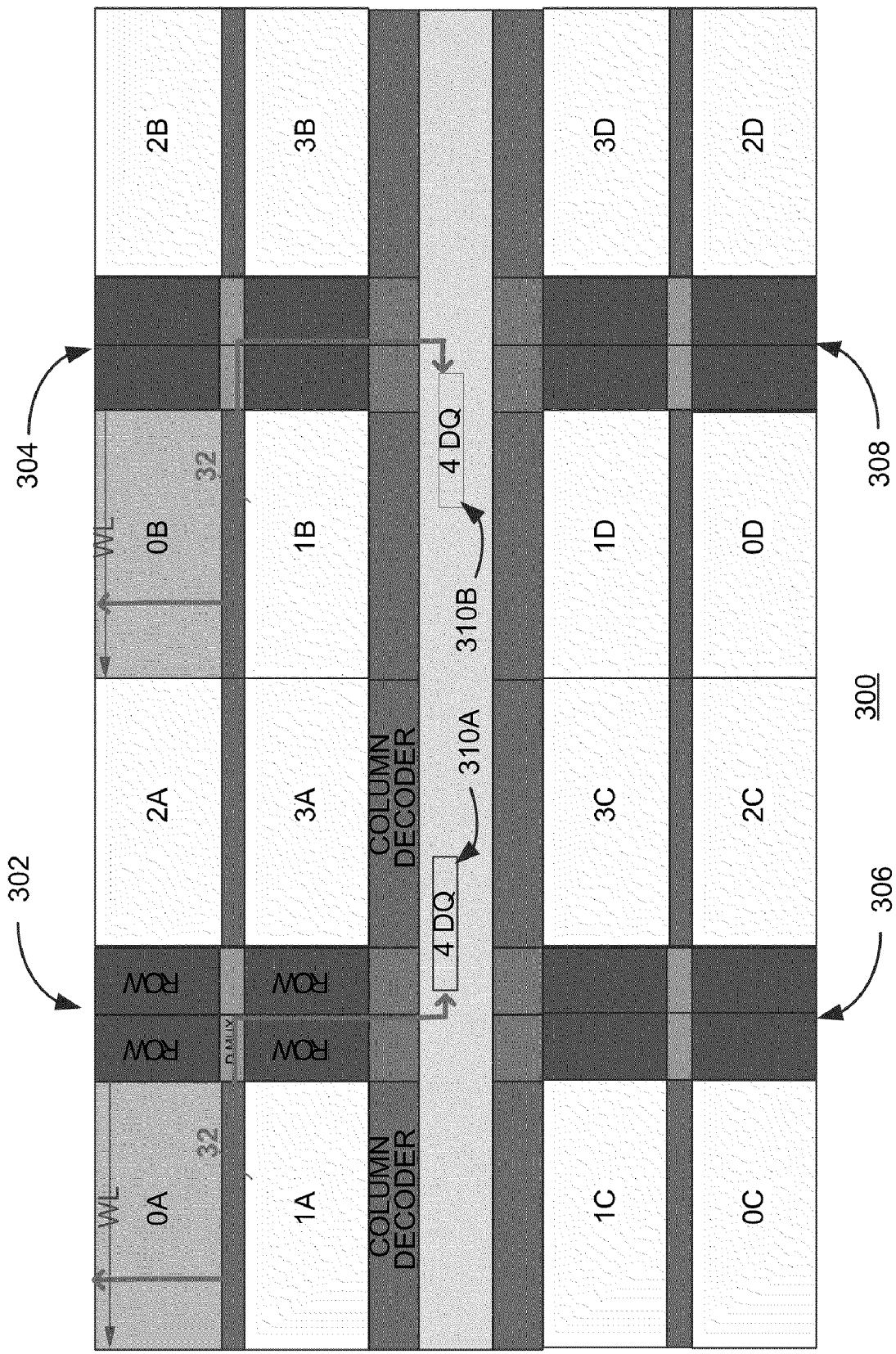
FIG. 3 is a block diagram illustrating selected aspects of a x8 DRAM device implemented according to an embodiment of the invention.

FIG. 3 is a block diagram of a x8 device using a common die approach, according to an embodiment of the invention. In some embodiments, when operating in x8 mode, two physical banks are activated (substantially) simultaneously in response to a RAS. Each physical bank may have a page size of N. From the host's perspective, DRAM 300 has a logical page size of 2N. For example, in the illustrated embodiment, banks 0A and 0B are activated (substantially) simultaneously in response to a RAS. Thus, DRAM 300 has 8 logical banks (each consisting of 2 physical banks) that are organized as four bank groups (302-308). In some embodiments, N is ½K. In alternative embodiments, N may have a different value.

M bits are pre-fetched internally from each activated physical bank to satisfy the external bandwidth requirements. In the illustrated embodiment, for example, 32 bits are pre-fetched from each of physical banks 0A and 0B. These bits are provided to DQ pads 310A and 310B. It is to be appreciated that, in alternative embodiments, M may have a different value. In some embodiments, the internal core frequency ranges from 200 to 400 MHZ. That is, the internal frequency may be $\frac{1}{8}^{th}$ of the external frequency as the internal bus may be 8 times as wide for a x4 device. In alternative embodiments, the range of the internal frequency, the range of the external frequency, and/or the ratio between the internal and external frequencies may be different.

Figure 4:
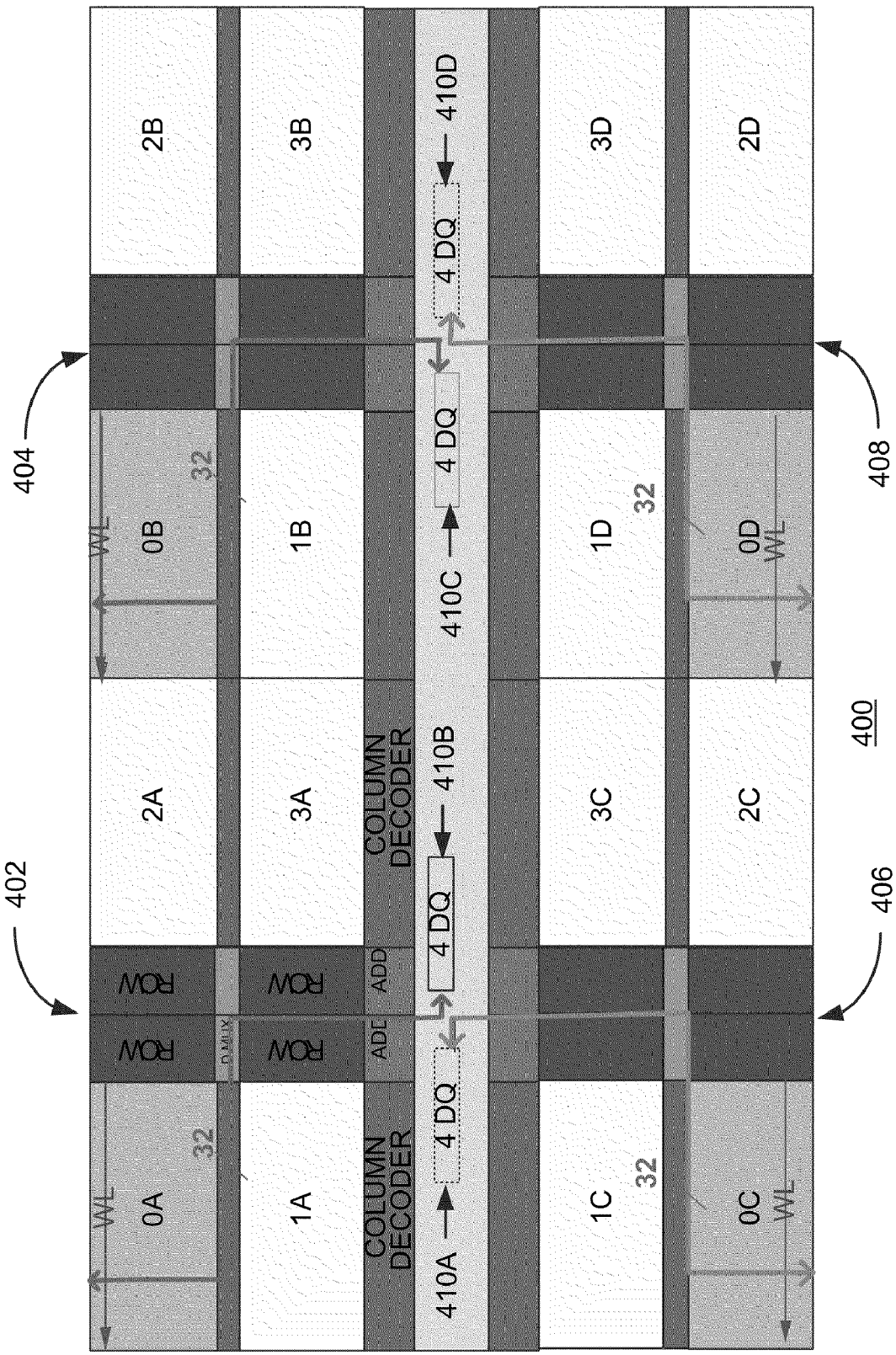
FIG. 4 is a block diagram illustrating selected aspects of a x16 DRAM device implemented according to an embodiment of the invention.

FIG. 4 is a block diagram of a x16 device using a common die approach, according to an embodiment of the invention. In some embodiments, when operating in x16 mode, four physical banks are activated (substantially) simultaneously in response to a RAS. Each physical bank may have a page size of N. From the host's perspective, DRAM 400 has a logical page size of 4N. For example, in the illustrated embodiment, banks 0A, 0B, 0C, and 0D are activated (substantially) simultaneously in response to a RAS. Thus, DRAM 400 has 4 logical banks (each consisting of 4 physical banks) that are organized as four bank groups (402-408). In some embodiments, N is ½K. In alternative embodiments, N may have a different value.

M bits are pre-fetched internally from each activated physical bank to satisfy the external bandwidth requirements. In the illustrated embodiment, for example, 32 bits are pre-fetched from each of physical banks 0A, 0B, 0C, and 0D.

These bits are provided to DQ pads 410A-410D. It is to be appreciated that, in alternative embodiments, M may have a different value.

Table 1 shows a number of different architecture options. The baseline is the DDR3 architecture with a 128 bit pre-fetch bus. The DRAM die size referred to in Table 1 is the die size of a 2 Gbit device. The die sizes for the listed options that are shown in Table 1 are relative to the baseline option. Also, the die size may vary across DRAM process technologies and DRAM densities and are shown as relative numbers only.

TABLE 1

| Option | Prefetch bus width | | | # of banks | | | | | | # of bank groups | | | Page Size | | | Die Size vs. baseline | Comment |
|---|---|---|---|---|---|---|---|---|---|---|---|---|---|---|---|---|---|
| | x4 | x8 | x16 | x4 logical | x4 physical | x8 logical | x8 physical | x16 logical | x16 physical | x4 | x8 | x16 | x4 | x8 | x16 | | |
| DDR3 | 128 | 128 | 128 | 8 | 16 | 8 | 16 | 8 | 16 | 1 | 1 | 1 | 1K | 1K | 2K | 0% | Baseline |
| 1 | 256 | 256 | 256 | 8 | 16 | 8 | 16 | 8 | 16 | 1 | 1 | 1 | 1K | 1K | 2K | 8% | double prefetch |
| 2 | 256 | 256 | 256 | 16 | 32 | 16 | 32 | 16 | 32 | 1 | 1 | 1 | 1K | 1K | 2K | 12% | double prefetch and banks |
| 3 | 128 | 128 | 128 | 16 | 32 | 16 | 32 | 16 | 32 | 2 | 2 | 2 | 1K | 1K | 2K | 4% | Two Bank groups and double banks |
| 4 | 128 | 128 | 128 | 16 | 32 | 16 | 32 | 16 | 32 | 4 | 4 | 4 | 1K | 1K | 2K | 8% | Four Bank groups and double banks |
| 5 | 64 | 64 | 128 | 16 | 16 | 16 | 16 | 8 | 16 | 4 | 4 | 2 | 1K | 1K | 2K | 1% | DDR4: 4/2 bank groups and double banks for x4/x8 |
| 6A | 32 | 64 | 128 | 16 | 16 | 8 | 16 | 4 | 16 | 4 | 2 | 1 | 1/2K | 1K | 2K | 1% | Invention w/ prefetch and pg sz optimized |
| 6B | 32 | 64 | 128 | 32 | 32 | 16 | 32 | 8 | 32 | 8 | 4 | 2 | 1/2K | 1K | 2K | 5% | Invention w/ additional resources |

Option 6A is the option illustrated in FIGS. 1-4. The additional die size of option 6A is similar to option 5 (DDR3). In the case of x4 devices, reducing the page size to ½K adds approximately 3% because of the additional column decoders. On the other hand, reducing the internal pre-fetch per bank group to 32 bits saves approximately 3% in die size. Thus, the net effect is a die size that is (approximately) the same as option 5.

In some embodiments, the number of bank resources are reduced by 50% each time the device width is doubled. For example, x16 devices may have 4 banks instead of 16 banks. Since x16 devices are typically used in a single rank configuration and in entry level systems the reduction in the bank resources is unlikely to be a significant issue. In addition, single rank systems typically have tFAW limitations that prevent the effective use of all banks.

Option 6B refers to an embodiment of the invention that addresses the reduction of bank resources associated with option 6A. According to option 6B, the number of physical banks are increased from 16 to 32. The 32 banks may be organized as 8 bank groups with 4 banks each. Option 6B may add (approximately) 4% in die size when compared with option 6A.

Figure 5:
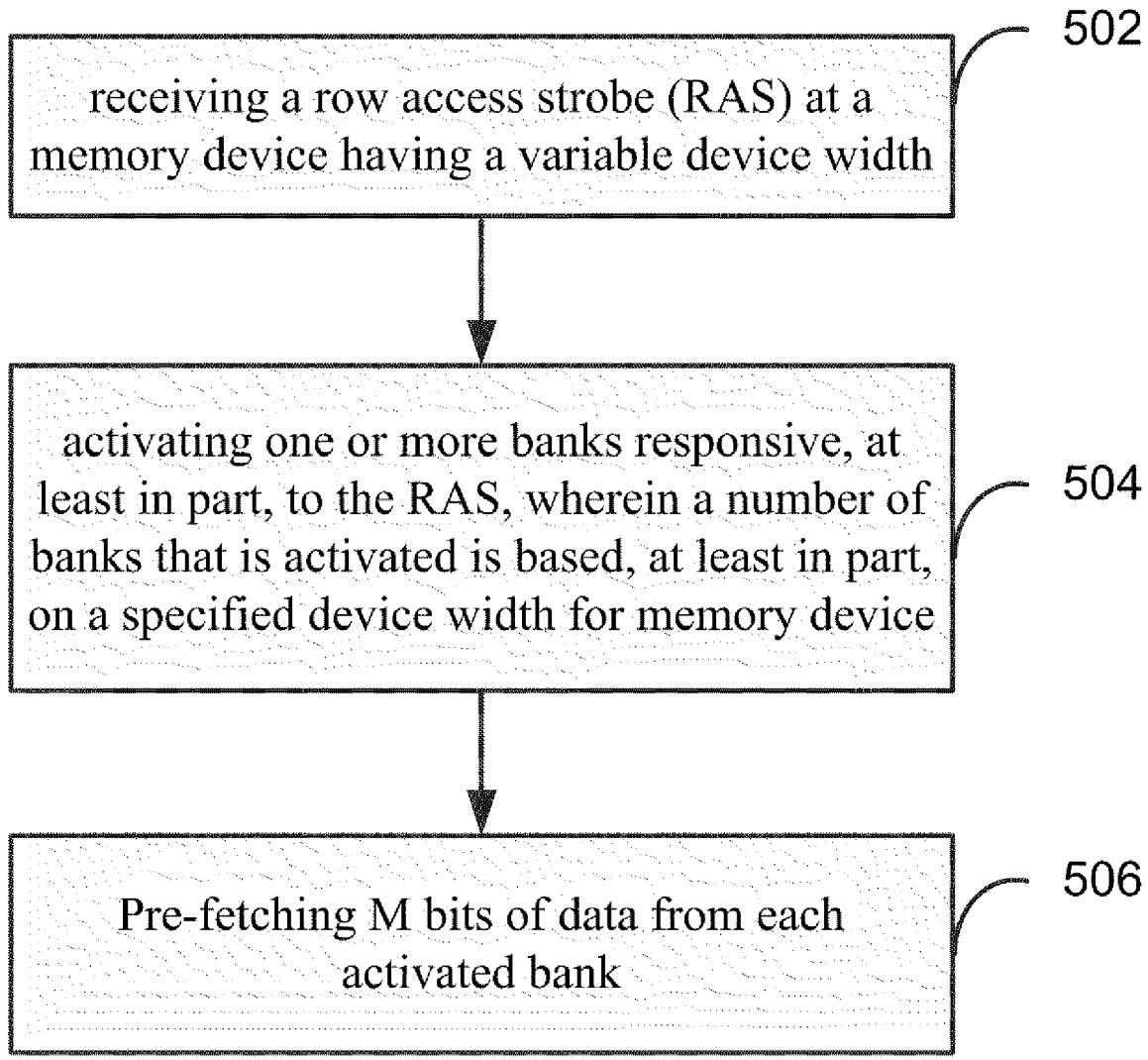
FIG. 5 is a flow diagram illustrating selected aspects of a method for accessing a memory device having a variable device width and scalable pre-fetch and page size, according to an embodiment of the invention.

FIG. 5 is a flow diagram illustrating selected aspects of a method for accessing a memory device having a variable device width and scalable pre-fetch and page size, according to an embodiment of the invention. Referring to process block 502, a memory device (e.g., DRAM 102, shown in FIG. 1) receives a RAS from a host (e.g., host 110).

Referring to process block 504, the memory device activates one or more physical banks. In some embodiments, the memory device has a common die for two or more device widths. The device width for a given instance of the memory device may be specified by a fuse or similar mechanism. The number of physical banks that are activated is based, at least in part, on the specified device width. For example, in some embodiments, a x4 device activates one physical bank, a x8 device activates two physical banks, and a x16 device activates four physical banks. In some embodiments, each physical bank contributes a page size of N. Thus, a x4 device might have a page size of N and a x8 device might have a (logical) page size of 2N. Similarly, a x16 device might have a (logical) page size of 4N.

Referring to process block 506, M bits of data are pre-fetched from each physical bank that is activated. For example, in some embodiments, M bits are pre-fetched for a x4 device (from one physical bank) and 2M bits are pre-fetched for a x8 device (from two physical banks). Similarly, 4M bits may be pre-fetched for a x16 device (from four physical banks).

Elements of embodiments of the present invention may also be provided as a machine-readable medium for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, propagation media or other type of machine-readable media suitable for storing electronic instructions. For example, embodiments of the invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the description above, certain terminology is used to describe embodiments of the invention. For example, the term "logic" is representative of hardware, firmware, software (or any combination thereof) to perform one or more functions.

For instance, examples of "hardware" include, but are not limited to, an integrated circuit, a finite state machine, or even combinatorial logic. The integrated circuit may take the form of a processor such as a microprocessor, an application specific integrated circuit, a digital signal processor, a microcontroller, or the like.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

What is claimed is:

1. A dynamic random access memory device comprising:
   logic to specify a device width for the dynamic random access memory device having a variable device width; and
   a memory core having a plurality of memory banks, each memory bank having a page size N, wherein the number of banks to be activated in response to a row address strobe (RAS) is based, at least in part, on the device width of the dynamic random access memory device
   and further wherein an amount of data to be pre-fetched by the dynamic random access memory device is based, at least in part, on the device width of the dynamic random access memory device.

2. The memory device of claim 1, wherein the logic to specify the device width is one of a fuse or a register bit.

3. The memory device of claim 1, wherein M bits of data are to be pre-fetched from each activated bank responsive, at least in part, to the RAS.

4. The memory device of claim 3, wherein the device width is one of x4, x8, and x16.

5. The memory device of claim 4, wherein N is ½ Kbit and M is 32 bits.

6. The memory device of claim 5, wherein the logic to specify the device width specifies that the device width is x4 and one bank is to be activated responsive, at least in part, to the RAS.

7. The memory device of claim 6, wherein 32 bits of data are to be pre-fetched from the memory core responsive, at least in part, to the RAS.

8. The memory device of claim 5, wherein the logic to specify the device width specifies that the device width is x8 and two banks are to be activated responsive, at least in part, to the RAS.

9. The memory device of claim 8, wherein 64 bits of data are to be pre-fetched from the memory core responsive, at least in part, to the RAS.

10. The memory device of claim 5, wherein the logic to specify the device width specifies that the device width is x16 and four banks are to be activated responsive, at least in part, to the RAS.

11. The memory device of claim 10, wherein 128 bits of data are to be pre-fetched from the memory core responsive, at least in part, to the RAS.

12. A method comprising:
    receiving a row access strobe (RAS) at a dynamic random access memory device having a variable device width;
    activating one or more banks responsive, at least in part, to the RAS, wherein a number of banks that is activated is based, at least in part, on a specified device width for the dynamic random access memory device; and
    pre-fetching data from the one or more banks, wherein the amount of data to be pre-fetched is based, at least in part, on the device width od the dynamic random access memory device.

13. The method of claim 12, further comprising:
    prefetching M bits of data from each activated bank.

14. The method of claim 13, wherein each of the one or banks has a page size of N.

15. The method of claim 14, wherein the specified device width is one of x4, x8, and x16.

16. The method of claim 15, wherein N is ½ Kbit and M is 32 bits.

17. The method of claim 16, wherein the specified device width is x4 and further wherein activating one or more banks responsive, at least in part, to the RAS comprises:
    activating one bank responsive, at least in part, to the RAS.

18. The method of claim 17, wherein prefetching M bits of data from each activated bank comprises:
    prefetching 32 bits of data.

19. The method of claim 16, wherein the specified device width is x8 and further wherein activating one or more banks responsive, at least in part, to the RAS comprises:
    activating two banks responsive, at least in part, to the RAS.

20. The method of claim 19, wherein prefetching M bits of data from each activated bank comprises:
    prefetching 64 bits of data.

21. The method of claim 16, wherein the specified device width is x16 and further wherein activating one or more banks responsive, at least in part, to the RAS comprises:
    activating four banks responsive, at least in part, to the RAS.

22. The method of claim 19, wherein prefetching M bits of data from each activated bank comprises:
    prefetching 128 bits of data.

23. A system comprising:
    a host to issue a row address strobe (RAS); and
    a dynamic random access memory device (DRAM) coupled with the host, the DRAM having a variable device width and including,
    logic to specify a device width for the DRAM, and
    a memory core having a plurality of memory banks, each memory bank having a page size N, wherein the number of banks to be activated in response to the RAS is based, at least in part, on the device width
    and further wherein an amount of data to be pre-fetched by the DRAM is based, at least in part, on the device width of the DRAM.

24. The system of claim 23, wherein M bits of data are to be pre-fetched from each activated bank responsive, at least in part, to the RAS.

25. The system of claim 24, wherein the device width is one of x4, x8, and x16.

26. The system of claim 25, wherein N is ½ Kbit and M is 32 bits.

27. The system of claim 26, wherein the specified device width is x4 and further wherein activating one or more banks responsive, at least in part, to the RAS comprises:

activating one bank responsive, at least in part, to the RAS.

28. The system of claim 27, wherein 32 bits of data are to be pre-fetched from the memory core responsive, at least in part, to the RAS.

29. The system of claim 26, wherein the logic to specify the device width specifies that the device width is x8 and two banks are to be activated responsive, at least in part, to the RAS.

30. The system of claim 29, wherein 64 bits of data are to be pre-fetched from the memory core responsive, at least in part, to the RAS.

* * * * *